(12) United States Patent
Carroll et al.

(10) Patent No.: US 6,271,477 B1
(45) Date of Patent: Aug. 7, 2001

(54) LONG-LASTING FLEXIBLE CIRCUITRY

(75) Inventors: David W. Carroll, Northfield; Terry L. Travis, Nerstrand, both of MN (US)

(73) Assignee: ViA, Inc., Burnsville, MN (US)

( * ) Notice: Subject to any disclaimer, the term of this patent is extended or adjusted under 35 U.S.C. 154(b) by 0 days.

(21) Appl. No.: 09/099,700

(22) Filed: Jun. 19, 1998

Related U.S. Application Data

(60) Provisional application No. 60/050,284, filed on Jun. 20, 1997.

(51) Int. Cl.[7] .......................................... H05J 1/00
(52) U.S. Cl. ......................... 174/254; 361/749; 361/789; 361/803
(58) Field of Search ..................... 174/254, 255; 361/744, 749, 784, 789, 803

(56) References Cited

U.S. PATENT DOCUMENTS

| | | | |
|---|---|---|---|
| 4,756,940 | 7/1988 | Payne et al. | 428/78 |
| 4,800,461 * | 1/1989 | Dixon et al. | 174/254 X |
| 5,004,639 | 4/1991 | Desai | 428/138 |
| 5,224,023 | 6/1993 | Smith et al. | 361/412 |
| 5,285,398 | 2/1994 | Janik | 74/640 |
| 5,491,651 | 2/1996 | Janik | 364/708.1 |
| 5,555,490 | 9/1996 | Carroll | 401/208 |
| 5,572,401 | 11/1996 | Carroll | 361/683 |
| 5,581,492 | 12/1996 | Janik | 364/708.1 |
| 5,798,907 | 8/1998 | Janik | 361/683 |

* cited by examiner

Primary Examiner—Albert W. Paladini
(74) Attorney, Agent, or Firm—Dicke, Billig & Czaja, P.A.

(57) ABSTRACT

An apparatus and method for extending the durability and life span of flexible circuitry by limiting the bend radius of the flexible circuitry and distributing the flexure point about an extended portion of the circuitry. The assembly includes one or more flex-limiting members associated with and integrated between the layers of flexible circuitry laminate. A fastener is affixed to the flexible circuitry laminate, operatively coupling the one or more flex-limiting members in position adjacent the flexible circuitry laminate. The flex-limiting member limits flexure of the circuitry, during each individual bend, to or below a predetermined angle, thereby decreasing the rate of failure in the circuitry, for example via short circuit, as a result of repeated or excessive bending.

24 Claims, 3 Drawing Sheets

LONG-LASTING FLEXIBLE CIRCUITRY

CROSS-REFERENCE TO RELATED APPLICATION

This application is directed to subject matter that is related to the subject matter of commonly assigned U.S. Provisional Application Ser. No. 60/050,284, filed Jun. 20, 1997, priority to which is claimed under 35 U.S.C. § 119(e), and which is incorporated herein by reference in its entirety.

BACKGROUND OF THE INVENTION

1. Field of the Invention

This invention relates to flexible circuitry and, more particularly, to devices and methods for substantially reducing failure of same resulting from excessive bending or flexing.

2. Description of Related Art

Circuitry can be arranged in a flexible form by containing the electronics within a thin, semi-flexible laminate. When so configured, as opposed to housing the circuitry within a semi-rigid printed circuit board, for example, the circuitry encounters an increased incidence of failure. The number of flexes that such circuitry can withstand before failure depends upon a number of factors, including the number of layers comprising the flexible circuitry, the thickness and width of associated circuitry elements and the sharpness of the bend, for example. Once the degree and number of bends reach a certain level, failure occurs. Such failures, which often occur in the form of a short circuit, most typically are the result of repeated or excessive flexure of the circuitry beyond elastic limit.

Certain flexible circuitry laminates include six layers, with positive and ground layers in the interior and two outer layers on either side. This particular class of circuitry can accommodate certain types of full-computer line layouts horizontally, for example in a $1^{3/4}$" width factor. Problems arise, however, when attempting to connect flexible 6-layer circuitry to stiffer portions of the product, or to other portions possessing increased stiffness. Such stiffer portions can be fixed- or stiff-section component areas, for example, a ball grid array covering the product, or can be in close proximity to such areas.

The stiff portions of the circuitry can endure a relatively low volume of flexure before failure compared to the flexible regions of the product. Further, in multiple-layer products, in particular, the most likely failure point generally is located at a connection point between a semi-rigid region and a flexible region. The problem is exacerbated as the thickness of the circuitry decreases, for example at 18 mil or thinner, as the flexure of the circuitry persists for a longer duration in thinner layers. Accordingly, stiff circuitry portions and their connection to more flexible circuitry portions generally present difficulties in a variety of environments and applications, including wearable-computer environments.

U.S. Pat. No. 5,581,492 granted to Janik, assigned to the assignee of the present application, and incorporated by reference herein, addresses the above-described problem by illustrating a series of substantially rigid members encompassing a flexible circuitry portion along its length. In a particular embodiment, the rigid members are characterized by a curvature at each of their respective ends to limit the radius of curvature experienced by the circuitry. The rigid members are illustrated as positioned externally to the flexible circuitry. Janik does not directly illustrate association or integration of flex-limiting members into or between the layers of the flexible circuitry laminate. Further, the rigid members of Janik are illustrated with, although not limited to, a generally uniform characteristic. No direct illustration is made with regard to insertion of single or multiple members of varying shape, size, material type, or durometer value, in various combinations, configurations, and arrangements to effect different minimum bend radii for different applications.

Accordingly, a need exists for an assembly to provide a solution to the aforementioned difficulties.

SUMMARY OF THE INVENTION

The present invention provides an assembly and method of use for extending the durability of e.g., flexible circuitry. According to one embodiment, the assembly comprises at least one flex-limiting member integrated into the flexible circuitry laminate. A fastener is affixed to the flexible circuitry laminate to operatively couple the flex-limiting member to the flexible circuitry laminate. The flex-limiting member operates to limit a flexure of the flexible circuitry at or beneath a predetermined angle to decrease the incidence of failure in the circuitry, for example via short circuit, as a result of repeated or acute bending.

DETAILED DESCRIPTION OF PREFERRED EMBODIMENTS

The invention provides an apparatus and method for extending the life of flexible circuitry by substantially reducing binding between layers and substantially restricting bending limits. The term "flexible circuitry" as used herein should be interpreted to include structures and methods as disclosed and taught in U.S. Pat. No. 5,581,492 granted to Janik, as well as other subsequent structures and methods known to one skilled in the art. Single or multiple members are inserted between layers of circuitry laminate to increase the radius of bending for a particular section of circuitry, according to one embodiment. The members can be selected to accommodate varying needs and requirements, including varying the geometry and durometer values of the members, as necessary. According to embodiments of the invention, members of differing composition are utilized in association with portions of the layers of flexible circuitry to create stations between the layers, thus, enabling a greater quantity of bending and like movement of the flexible circuitry prior to failure. Embodiments of the invention operate to prevent the layers from binding and to limit the degree of bending during each individual flexure of the circuitry by creating and maintaining a minimum bend radius. By positioning members in various combinations, configurations and arrangements, either inside or outside the respective layers of circuitry, durability and thus life span of the circuitry can be greatly enhanced.

Figure 1:
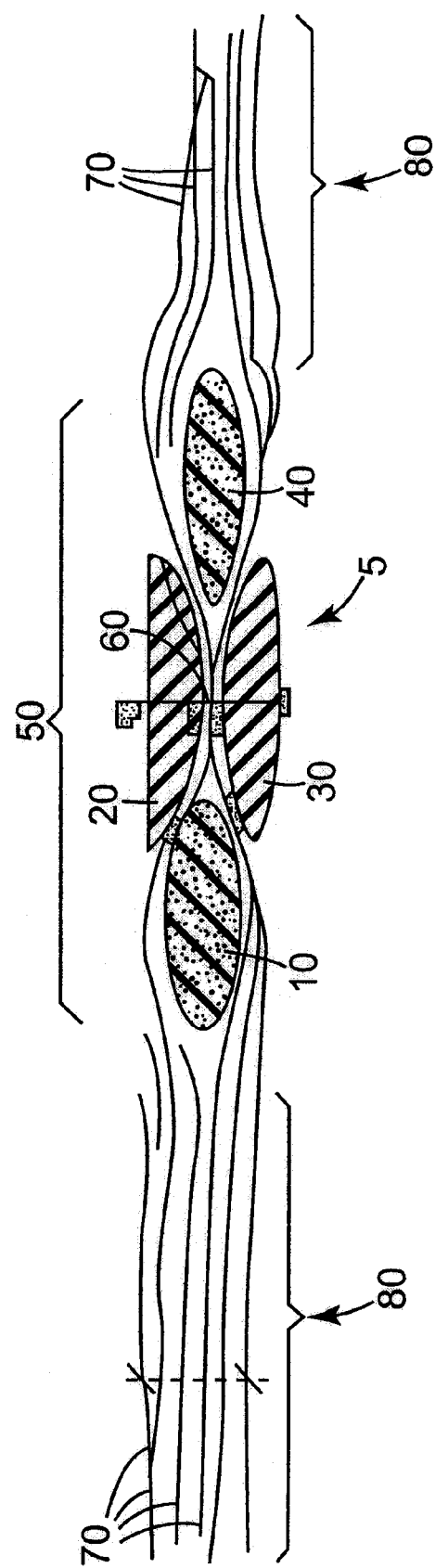
FIG. 1 is a cross-sectional view of an embodiment of the invention depicting the limited flex area positioned in a portion of flexible circuitry.

The invention provides assembly 5 for prolonging the useful life of flexible circuitry and related systems. As illustrated in FIG. 1, assembly 5 comprises flex-limiting members 10, 20, 30, and 40 positioned between and/or around the layers of laminate comprising the flexible circuitry 70. The laminate is generally comprised of two distinct regions, limited flex area 50 and an additional area 80. Area 80 is relatively stiff compared to area 50, according to one embodiment, but can also be of equal stiffness or lesser stiffness than area 50. Area 80 is not necessarily adapted for rigorous bending and may be housed in a rubber-type jacket. Members 20, 30 are held in place between or around the respective layer or layer groupings of circuitry 70 by mechanical fastener 60. Fastener 60 may include adhesive bonds, clips or any other mechanism known by one skilled in the art. Fasteners 60 are similarly contemplated for members 10, 40 and for any other combination of members. In one embodiment of the invention, fastener 60 between members 10, 40 is integral with fastener 60 about members 20, 30. Fastener 60 may also comprise multiple separate attachment mechanisms. One or more different methods of affixation may be utilized simultaneously to suit the particular environment.

In one embodiment of the invention, flexible circuitry 70 comprises six distinct layers. As the circuitry approaches first member 10, the layers divide and pass on either side of member 10. In FIG. 1, the six layers split equally, with two 3-layer groups extending around member 10. Once past member 10, the two groups again join to form a single 6-layer group and pass between members 20, 30. Flexible circuitry 70 then divides once again into two 3-layer groups, passing on either side of member 40, beyond which flexible circuitry 70 again joins to form a single 6-layer group. By spanning members 10, 20, 30, and 40 over a distance, the flex point is spread over a long segment of flexible circuit 70. Such distribution of the flex point prevents or at least greatly reduces the tendency of the circuit layers to bind against one another. As a result, vast improvements in flexing durability of circuitry 70 are achieved according to the invention.

Of course, the above-described embodiment is merely illustrative in that the invention will accommodate flexible circuitry 70 with any number of layers. It is contemplated according to the invention that the laminate layers be divided into groupings each having the same number of layers, such as three 2-layer groupings, or, alternatively, into unequal bundles, such as a 4-layer and a 2-layer group. Single-layer groups are also contemplated. Likewise, a wide variety of combinations and configurations of members 10, 20, 30, and 40 are contemplated, other than that illustrated in FIGS. 1–2, such as a two-member configuration wherein the members are in parallel. The exact number of layers, members, and groups of layers will vary and will be dependent upon the needs of the particular application or environment, for example when the flexible circuitry is used as a motherboard.

Figure 2:
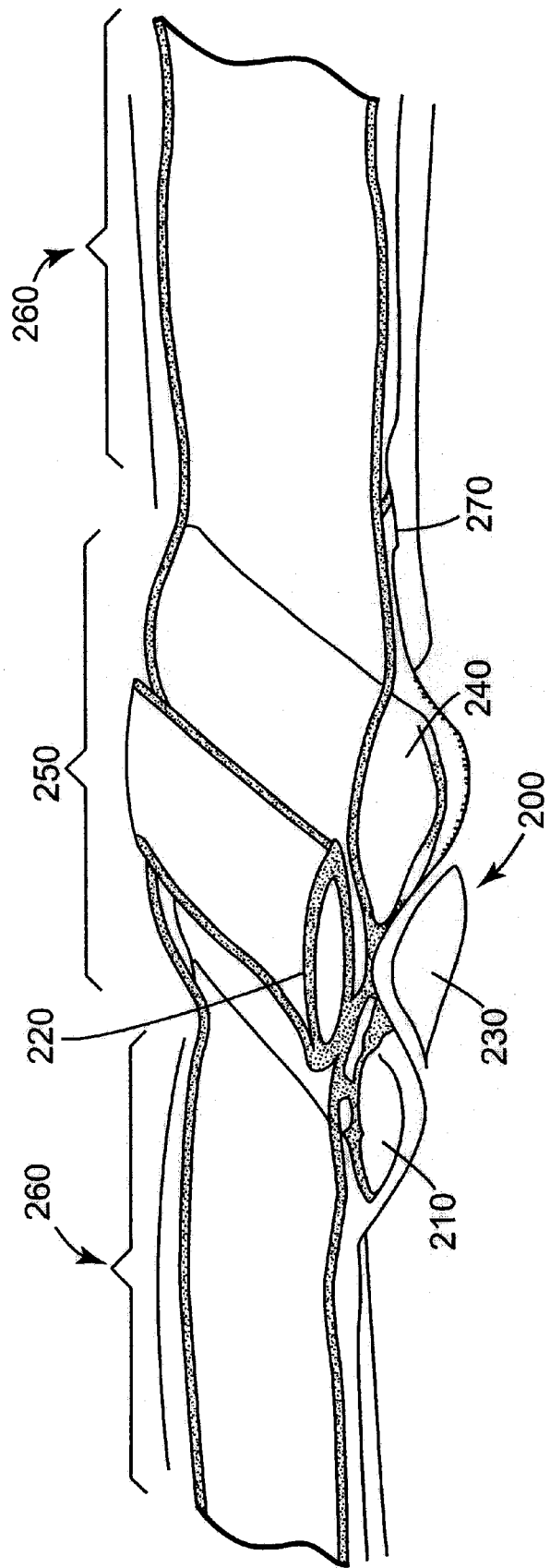
FIG. 2 is a perspective view of a further embodiment of the invention depicting placement of a plurality of flex-limiting members within a portion of flexible circuitry.

In a further embodiment of the invention, as illustrated in FIG. 2, assembly 200 comprises flex-limiting members 210, 220, 230, and 240 positioned within flexible circuitry 270. As circuitry 270 traverses from area 260, e.g., a stiff portion or flexible portion, into limited flex area 250, the multi-layered laminate approaches member 210. Members 220, 230 are constructed of a material that is much more stiff than are members 210, 240. Members 220, 230 may be constructed, for example, of a rubber or similar styled material, while members 210, 240 may be constructed of a foam or other softer material. Material composition, durometer value, configuration, and dimension for each particular member, or all members collectively, can vary to accommodate specific environments on an application-by-application basis.

The varied characteristics of members 210, 220, 230, and 240 provide particular advantage in a variety of applications. For example, heavier groups of flexible circuitry 270 may use wider members 210, 240 or, alternatively, 210, 220, 230, and 240, to increase the bend radius, thereby reducing bend sharpness, of flexible circuitry 270. For thinner groups of flexible circuitry, having fewer layers for instance, the dimensions of all or selected members 210, 220, 230, and 240 can be altered. As illustrated in FIG. 2, members 210, 220, 230, and 240 assume a substantially oval shape. Members 210, 220, 230, and 240, however, may take any of a variety of shapes to accommodate flexible circuitry 270 needed for a particular situation. A more rounded configuration may be desirable, for example, in areas of flexible circuitry 270 in which the maximum number of permissible bends is less critical than is the width or other spacing considerations between areas 260.

Figure 3:
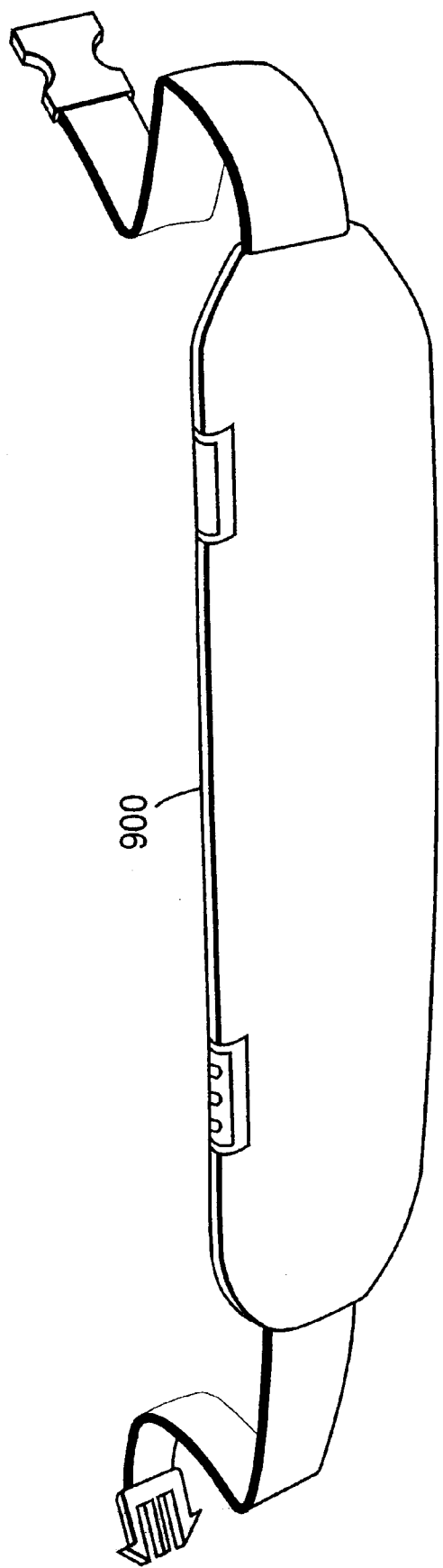
FIG. 3 is a perspective view showing a casement usable according to an embodiment of the invention.

According to a further embodiment of the invention, a casement can be positioned to surround limited flex area 250, area 260, or both. Note casement 006 in e.g. FIG. 5 of the commonly assigned Janik patent previously incorporated by reference herein, a portion of which is reproduced herein as FIG. 3. The casement can optionally be characterized by a flex-limiting design. Such a casement, or a similar type casement may be utilized to retain one or more of members 210, 220, 230, 240 or others, in proximity and spatial relation with each other. A casement made, for example, out of a lithium ion/polymer battery would provide extra stiffness and advantage.

While the present invention has been described with reference to particular preferred embodiments, the invention is not limited to the specific examples given. The features of the various embodiments described hereinabove can be used and implemented either collectively or individually to suit the particular environment. This invention contemplates use in a multiplicity of different applications to varied flexible circuitry-type structures, including but not limited to ribbon cabling, fiber optic cabling, and other wire- and conductor-type devices. Various other modifications will occur to those of ordinary skill, and other embodiments and modifications can be made by those skilled in the art without departing from the spirit and scope of the invention as defined in the following claims.

What is claimed is:

1. An assembly for extending the durability of flexible circuitry, the assembly comprising:

at least one flex-limiting member; and a fastener coupled to the flex-limiting member;

wherein the flex-limiting member functions to limit flexure of the flexible circuitry;

wherein the fastener operates to couple the at least one flex-limiting member and the flexible circuitry at the fastener; and wherein at least a first flex-limiting member is constructed of a first material, further wherein at least a second flex-limiting member is constructed of a second material.

2. The assembly of claim 1, wherein the assembly is constructed to extend durability of flexible circuitry used as a motherboard.

3. The assembly of claim 1, wherein the first flex-limiting member possesses a higher durometer value than does the second flex-limiting member.

4. The assembly of claim 1, wherein the fastener comprises a casement constructed to be placed about a portion of the flexible circuitry and the flex-limiting members, the casement being constructed to maintain the position of the flex-limiting members.

5. The assembly of claim 4, wherein the casement operates to maintain the spatial relation between the flex-limiting members.

6. The assembly of claim 1, wherein the first material comprises foam and the second material comprises rubber.

7. The assembly of claim 1, in combination with flexible circuitry comprising a group of layers;
wherein at least a first group of layers comprises a first quantity of flexible circuitry; and
wherein at least a second group of layers comprises a second quantity of flexible circuitry.

8. The assembly of claim 7, wherein the first quantity and the second quantity are substantially equal.

9. An assembly for extending the life of flexible circuitry, the assembly comprising:
means for increasing a bend radius of the flexible circuitry, the means for increasing comprising a first flex-limiting member and a second flex-limiting member, the first flex-limiting member possessing a higher durometer value than the second flex-limiting member; and
means for maintaining the spatial orientation between the means for increasing and the flexible circuitry, the means for maintaining comprising a fastener constructed to be placed about a portion of the flexible circuitry and the first and second flex-limiting members;
wherein at least a portion of the means for increasing is constructed to be internal to the flexible circuitry.

10. The assembly of claim 9, in combination with the flexible circuitry.

11. A method of minimizing failure as a result of repetitive bending of flexible circuitry, the method comprising:
selecting a first flex-limiting member of a first rigidity;
selecting a second flex-limiting member of a second rigidity, the second rigidity being different than the first rigidity;
associating the first and second flex-limiting members with the flexible circuitry; and
maintaining the position of the flex-limiting members relative to the flexible circuitry with a fastener, placed about a portion of the flexible circuitry and the flex-limiting members, to increase a bend radius of the flexible circuitry.

12. The method of claim 11, wherein at least one of the flex-limiting members is disposed within the flexible circuitry.

13. An assembly for extending the durability of flexible circuitry, the assembly comprising:
at least one flex-limiting member; and
a fastener coupled to the at least one flex-limiting member, the fastener comprising a casement constructed to be placed about a portion of the flexible circuitry and the at least one flex-limiting member, the casement being constructed to maintain the position of the at least one flex-limiting member;
wherein the at least one flex-limiting member functions to limit flexure of the flexible circuitry;
wherein the fastener operates to couple the at least one flex-limiting member and the flexible circuitry; and
wherein at least a first flex-limiting member is constructed of a first material, further wherein at least a second flex-limiting member is constructed of a second material.

14. An assembly for extending the durability of flexible circuitry, the assembly comprising:
at least one flex-limiting member; and
a fastener coupled to the flex-limiting member;
wherein the flex-limiting member functions to limit flexure of the flexible circuitry;
wherein the fastener operates to couple the at least one flex-limiting member and the flexible circuitry; and
wherein at least a first flex-limiting member is constructed of a first material comprising foam, further wherein at least a second flex-limiting member is constructed of a second material comprising rubber.

15. The assembly of claim 14, further comprising an additional flex-limiting member, the additional flex-limiting member being harder than the member comprising foam.

16. A flexible circuitry assembly, comprising:
flexible circuitry, the flexible circuitry comprising a plurality of signal-conducting layers; and
at least one flex-limiting member for limiting flexure of the flexible circuitry, the at least one flex-limiting member being disposed between two of the signal-conducting layers such that said two layers are joined together at one end of the member, separated by the member along opposite side surfaces of the member, and re-joined at an end of the member opposite said one end of the member.

17. The assembly of claim 16, wherein the assembly comprises a plurality of flex-limiting members, the plurality of flex-limiting members being constructed of different materials.

18. The assembly of claim 16, wherein the assembly comprises a plurality of flex-limiting members, at least one of the flex-limiting members being within the flexible circuitry and at least one of the flex-limiting members being external to the flexible circuitry.

19. The assembly of claim 16, wherein the at least one flex-limiting member is electrically non-conductive.

20. The assembly of claim 16, further comprising a fastener coupled to the at least one flex-limiting member, the fastener operating to couple the at least one flex-limiting member and the flexible circuitry.

21. An assembly for extending the durability of flexible circuitry, the assembly comprising:
at least one flex-limiting member; and
a fastener coupled to the flex-limiting member;
wherein the flex-limiting member functions to limit flexure of the flexible circuitry;
wherein the fastener operates to couple the at least one flex-limiting member and the flexible circuitry; and
wherein the flex-limiting member is disposed at least partially within the flexible circuitry.

22. The assembly of claim 21, wherein at least a first flex-limiting member is constructed of a first material, further wherein at least a second flex-limiting member is constructed of a second material.

23. Flexible circuitry, in combination with an assembly for extending the life of the flexible circuitry, the assembly comprising:
means for increasing a bend radius of the flexible circuitry, the means for increasing comprising a first flex-limiting member and a second flex-limiting member, the first flex-limiting member possessing a higher durometer value than the second flex-limiting member; and
means for maintaining the spatial orientation between the means for increasing and the flexible circuitry, the means for maintaining comprising a fastener constructed to be placed about a portion of the flexible circuitry and the first and second flex-limiting members.

24. The flexible circuitry of claim 23, wherein at least a portion of the means for increasing is disposed within the flexible circuitry.

* * * * *